United States Patent
Au et al.

(10) Patent No.: US 8,219,894 B2
(45) Date of Patent: *Jul. 10, 2012

(54) ARCHITECTURE AND CONTROL OF REED-SOLOMON ERROR-CORRECTION DECODING

(75) Inventors: Siu-Hung Fred Au, Fremont, CA (US); Gregory Burd, San Jose, CA (US); Zining Wu, Los Altos, CA (US); Jun Xu, Sunnyvale, CA (US); Ichiro Kikuchi, Yokohama (JP); Tony Yoon, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 811 days.

This patent is subject to a terminal disclaimer.

(21) Appl. No.: 12/324,285

(22) Filed: Nov. 26, 2008

(65) Prior Publication Data

US 2009/0083608 A1 Mar. 26, 2009

Related U.S. Application Data

(60) Continuation of application No. 12/249,474, filed on Oct. 10, 2008, which is a division of application No. 11/195,087, filed on Aug. 1, 2005, now Pat. No. 7,444,582.

(60) Provisional application No. 60/680,969, filed on May 12, 2005, provisional application No. 60/622,429, filed on Oct. 27, 2004.

(51) Int. Cl.
*H03M 13/00* (2006.01)
(52) U.S. Cl. .................................. 714/784; 714/780
(58) Field of Classification Search .................. 714/784, 714/780
See application file for complete search history.

(56) References Cited

U.S. PATENT DOCUMENTS

| | | | |
|---|---|---|---|
| 4,541,092 A | 9/1985 | Sako et al. |
| 5,373,511 A | 12/1994 | Veksler |
| 5,450,421 A | 9/1995 | Joo et al. |
| 5,452,310 A | 9/1995 | Arts |
| 5,574,979 A | 11/1996 | West |
| 5,732,093 A | 3/1998 | Huang |
| 5,844,918 A | 12/1998 | Kato |
| 6,625,775 B1 | 9/2003 | Kim |
| 6,961,197 B1 | 11/2005 | Burd et al. |
| 7,099,411 B1 | 8/2006 | Wu et al. |
| 7,120,850 B2 | 10/2006 | Lehobey et al. |
| 7,131,052 B2 | 10/2006 | Hassner et al. |
| 7,185,259 B2 | 2/2007 | Fujita et al. |
| 7,203,893 B2 | 4/2007 | Kerr et al. |

(Continued)

OTHER PUBLICATIONS

R. Blahut, *Theory and Practice of Error Control Codes*, p. 267-272, 1983.

(Continued)

*Primary Examiner* — M. Mujtaba K Chaudry

(57) ABSTRACT

Systems and methods are provided for implementing various aspects of a Reed-Solomon (RS) error-correction system. A detector can provide a decision-codeword from a channel and can also provide soft-information for the decision-codeword. If the decision-codeword corresponds to an inner code and an RS code is the outer code, a soft-information map can process the soft-information for the decision-codeword to produce soft-information for a RS decision-codeword. A RS decoder can employ the Berlekamp-Massey algorithm (BMA), list decoding, and a Chien search, and can include a pipelined architecture. A threshold-based control circuit can be used to predict whether list decoding will be needed and can suspend the list decoding operation if it predicts that list decoding is not needed.

15 Claims, 16 Drawing Sheets

U.S. PATENT DOCUMENTS

| | | | |
|---|---|---|---|
| 7,231,575 | B2 | 6/2007 | Kauschke et al. |
| 7,328,395 | B1 | 2/2008 | Burd |
| 7,444,582 | B1 | 10/2008 | Au et al. |
| 7,454,690 | B1 | 11/2008 | Au et al. |
| 2003/0103582 | A1 | 6/2003 | Linsky et al. |
| 2003/0123389 | A1 | 7/2003 | Russell et al. |
| 2003/0128777 | A1 | 7/2003 | Linsky et al. |
| 2006/0174181 | A1* | 8/2006 | Banks et al. .......... 714/784 |
| 2009/0063937 | A1 | 3/2009 | Au et al. |

OTHER PUBLICATIONS

D. Chase, "A Class of Algorithms for Decoding Block Codes with Channel Measurement Information," *IEEE Trans. Infor. Theory*, vol. IT-18, No. 1, Jan. 1972, pp. 170-182.

G.D. Forney, Jr., "Generalized Minimum Distance Decoding," *IEEE Trans. Infor. Theory*, vol. IT-12, No. 2, Apr. 1966, pp. 125-131.

V. Guruswami, M. Sudan, "Improved Decoding of Reed-Solomon and Algebraic-Geometry Codes," *IEEE Trans. Infor. Theory*, vol. 45, No. 6, Sep. 1999, pp. 1757-1767.

R. Koetter and A. Vardy, "Algebraic Soft-Decision Decoding of Reed-Solomon Codes", *IEEE Trans. Infor. Theory*, vol. 49, No. 11, Nov. 2003, pp. 2809-2825.

M. Sudan, "Decoding of Reed Solomon codes beyond the error-correction bound," J. complexity, vol. 12, pp. 180-193, 1997.

E. Berlekamp, *Algebraic Coding Theory*, pp. 218-240, 1984.

U.S. Appl. No. 11/195,403, filed Aug. 1, 2005.

U.S. Appl. No. 10/313,651, filed Dec. 6, 2002.

\* cited by examiner

Computation Intervals

| CS/EEC 1 (Validity) | 1 (Yes) | 2 (No) | 3 (Yes) | 4 (Yes) | 5 (Yes) | 6 (Yes) | ... |
|---|---|---|---|---|---|---|---|
| List decoding | | Suspend | 2 | Suspend | Suspend | Suspend | |
| CS/EEC 2 | | | Suspend | 2 | Suspend | Suspend | |
| Transfer out | | 1 | | 3 | 2, 4 | 5 | |
| External Memory | | | 1 | 1 | 1 3 | 2 3 4 | |

FIG. 10

ARCHITECTURE AND CONTROL OF REED-SOLOMON ERROR-CORRECTION DECODING

CROSS-REFERENCE TO RELATED APPLICATIONS

This application is a continuation of U.S. patent application Ser. No. 12/249,474 filed Oct. 10, 2008, which is a division of U.S. application Ser. No. 11/195,087 filed Aug. 1, 2005, now U.S. Pat. No. 7,444,582, which claims the benefit of U.S. Provisional Application Nos. 60/622,429, filed Oct. 27, 2004 and 60/680,969, filed May 12, 2005 which are incorporated herein by reference in their entirety.

BACKGROUND OF THE INVENTION

This invention relates to Reed-Solomon error-correction codes (RS ECC) and, more particularly, to systems and methods for implementing the RS ECC receive-side operations.

Electronic information is increasingly being relied upon as a preferred medium for conducting business and/or personal transactions. As a result, demands for even better information storage and/or communication technologies are also increasing. The advances in this area of technology are apparent in telecommunication and information storage devices, where developments in throughput and storage density are allowing users to process information at much greater rates and quantities than before.

To guarantee some degree of information integrity, many communications and storage devices include error-correction technologies. Such technologies generally involve configuring information in a way that allows the information to be recoverable even when parts of the information are altered or missing. In error-correction, this process of configuring information is referred to as "encoding," and the counterpart process of recovering information is referred to as "decoding." Therefore, unless otherwise specified, the term "coding" will be used herein to refer to a particular way of encoding and decoding information.

In the field of error-correction codes (ECC), of particular note is the Reed-Solomon (RS) error-correction code. Since its discovery, the Reed-Solomon ECC has had a profound impact on the information industry in terms of shaping consumer expectations. In modern day applications, the Reed-Solomon ECC can be found in everyday devices such as compact disk players, where RS ECC technology has helped to provide high quality audio playback even from scratched CD surfaces.

Despite its effectiveness, the suitability of the Reed-Solomon ECC in certain applications may be limited by practical considerations. RS ECC encoding and decoding techniques are relatively complex, and practical issues generally concern whether RS ECC operations can be completed in the time and using the resources allotted by an application. Interestingly, when the RS ECC was first developed, processing technology had not yet developed to the point where applying the RS ECC in consumer devices was practical. Although technology for implementing RS ECC has improved greatly since then, technological improvements in applications that benefit from RS ECC have also kept pace. Accordingly, allowances of time, power, and/or hardware resources for RS ECC in modern applications continue to become more stringent.

Developments in coding theory continue to improve the capabilities of the RS ECC. In conjunction with these efforts, device and architectural improvements in implementation continue to aid its application to conventional and emerging electronic devices. Accordingly, there is continued interest in improving the Reed-Solomon error-correction code on both a theoretical and a practical level.

SUMMARY OF THE INVENTION

In accordance with the disclosed invention, systems and methods are provided for implementing various aspects of a Reed-Solomon (RS) error-correction coding system (ECC). In general, a decoder that uses soft-information to perform decoding is referred to as a "soft decoder" and a decoder that does not use soft-information to perform decoding is referred to as a "hard decoder." The disclosed systems and methods provide a hard Reed-Solomon ECC RS(n,k) that has the capability to correct up to $t=(n-k)/2$ erroneous symbols in a decision-codeword. When the number of symbol errors in a decision-codeword is greater than t, a soft RS ECC decoder system and method using soft-information is provided that has the capability to correct more than t errors. Where a RS ECC decoder is referred to herein without a "soft" or "hard" designation, it will be understood that the RS ECC decoder can refer to one or both types of RS ECC decoders.

An RS decoder can include an input interface for receiving a decision-codeword and a soft-information component that can receive and store soft-information for the decision-codeword. The soft-information component can include a list of most-likely error events, a list of next-most-likely values, one or more incidence vectors that correspond to combinations of the most-likely error events, and/or other soft-information. The soft-information component can maintain indicators associated with the incidence vectors to identify which incidence vectors have been processed by list decoding. The RS decoder also includes a pipelined architecture that has several pipeline stages. The pipelined architecture contains at least a first stage for producing an error indicator based on a decision-codeword, a second stage for producing a second error indicator based on a modified decision-codeword, and a third stage for determining the validity of the decision-codeword and/or the modified decision-codeword.

In one embodiment, the first stage can implement the Berlekamp-Massey algorithm (BMA), and the second stage can implement list decoding. Additionally, the list decoding can employ iterative decoding and the validity test. Both the BMA and the list decoding stages can generate error locator polynomials. The third stage can implement a Chien search as well as an error evaluation and correction algorithm such as the Forney algorithm. The pipelined architecture can receive a clock signal that is indicative of a computing interval for the pipelined computations.

In one embodiment, a list decoding stage can occur before a Chien search stage in the pipelined architecture. In one embodiment a Chien search stage can occur between a BMA stage and a list decoding stage, such that a control circuit can suspend the list decoding stage if the Chien search determines that the BMA error locator polynomial is valid. Additionally, the pipelined architecture can include a separate syndrome computation stage and/or a transfer out stage. In one embodiment, the BMA and list decoding operations can be performed in a single pipeline stage.

In one embodiment, a RS ECC decoder can include a threshold-based control circuit that predicts whether list decoding will be needed. The prediction can be based on the value $t=(n-k)/2$ of a RS(n,k) code, a threshold value, and the degree d of an error locator polynomial. If $d \leq (t-\text{threshold})$, then the control circuit can predict that list decoding will not be needed. Otherwise, the control circuit concludes that list decoding is needed. In one embodiment, the control circuit can direct a list decoding component to suspend operation if it concludes that list decoding will not be needed. In one embodiment, an RS ECC decoder can employ a threshold-based control circuit with a pipelined architecture such that the control circuit can direct a list decoding stage to suspend operation if it predicts that list decoding will not be needed.

In one embodiment, an error-correction system may include serially concatenated error-correction/modulation codes. In one embodiment, the RS ECC can be an outer code while the second code, such as RLL or Single Parity Check Code, can be an inner code. A detector and/or a post processor can provide an inner decision-codeword with soft-information for the inner decision-codeword. An inner decoder can decode the inner decision-codeword to provide an RS decision-codeword. A soft-information map can provide soft-information for the RS decision-codeword by mapping the soft-information for the inner decision-codeword to the RS decision-codeword.

Soft-information for the inner decision-codeword can include one or more most-likely error events and one or more corresponding next-most likely values. This soft-information can be used to produce a modified inner decision-codeword, which can be decoded by the inner decoder to produce a modified RS decision-codeword. An identification circuit of the soft-information map can compare the modified RS decision-codeword with a corresponding RS decision-codeword to identify the locations of any corresponding symbols that have different values. Soft-information for the RS decision-codeword can include any such identified symbol locations and the difference between the symbol values at the symbol locations.

In one aspect of the invention, means are provided for implementing various aspects of a RS ECC system. An RS decoder can include an input means for receiving a decision-codeword and soft-information means for receiving and storing soft-information for the decision-codeword. The soft-information means can store a list of most-likely error events, a list of next-most-likely values, one or more incidence vectors that correspond to combinations of the most-likely error events, and/or other soft-information. The soft-information means can include means for maintaining indicators associated with the incidence vectors to identify which incidence vectors have been processed by list decoding. The RS decoder also includes a pipelined means for performing decoding in a pipelined progression. The pipelined means contains at least a first stage means for producing an error indicator based on a decision-codeword, a second stage means for producing a second error indicator based on a modified decision-codeword, and a third stage means for determining the validity of the decision-codeword and/or the modified decision-codeword.

In one embodiment, the first stage means can include means for performing the Berlekamp-Massey algorithm (BMA), and the second stage means can include means for performing list decoding. Additionally, the list decoding means can include means for employing iterative decoding and means for employing the validity test. Both the means for performing BMA and the means for performing list decoding can include means for generating error locator polynomials. The third stage means can include means for performing a Chien search as well as means for performing an error evaluation and correction algorithm such as the Forney algorithm. The pipelined means include means for receiving a clock signal that is indicative of a computing interval for the pipelined computations.

In one embodiment, the means for performing list decoding can occur before the means for performing Chien search in the pipelined means. In one embodiment a Chien search means can occur between a BMA means and a list decoding means. The control means can include means for suspending the list decoding stage if the Chien search determines that the BMA error locator polynomial is valid. Additionally, the pipelined means can include a separate means for performing syndrome computations and/or a means for transferring out a decoded dataword. In one embodiment, the BMA and list decoding operations can be performed by a single pipeline stage means.

In one embodiment, a RS ECC decoder can include a threshold-based control means for predicting whether list decoding will be needed. The prediction can be based on the value $t=(n-k)/2$ of a RS(n,k) code, a threshold value, and the degree d of an error locator polynomial. If $d \leq (t-\text{threshold})$, then the control means can predict that list decoding will not be needed. Otherwise, the control means concludes that list decoding is needed. In one embodiment, the control means can include means for directing a list decoding means to suspend operation if it concludes that the list decoding means will not be needed. In one embodiment, an RS ECC decoder can include a threshold-based control means and a pipelined means, such that the control means can direct a list decoding stage means of the pipelined means to suspend operation if it predicts that the list decoding stage means will not be needed.

In one embodiment, an error-correction system may include serially concatenated error-correction/modulation codes. In one embodiment, the RS ECC can be an outer code while the second code, such as RLL or Single Parity Check Code, can be an inner code. The error-correction system can include a detector means and/or a post processor means for providing an inner decision-codeword with soft-information for the inner decision-codeword, an inner decoder means for decoding the inner decision-codeword to provide an RS decision-codeword, and a soft-information map means for providing soft-information for the RS decision-codeword by mapping the soft-information for the inner decision-codeword to the RS decision-codeword.

Soft-information for the inner decision-codeword can include one or more most-likely error events and one or more corresponding next-most likely values. An inner decoder means can use this soft-information for producing a modified inner decision-codeword, which can be decoded by the inner decoder means to produce a modified RS decision-codeword. The soft-information map means can include an identification means for comparing the modified RS decision-codeword with a corresponding RS decision-codeword to identify the locations of any corresponding symbols that have different values. Soft-information for the RS decision-codeword can include any such identified symbol locations and the difference between the symbol values at the symbol locations.

In one aspect of the invention, computer programs running on a processor are provided for implementing various aspects of a RS ECC system. A computer program running on a processor can maintain indicators associated with incidence vectors and can identify which incidence vectors have been processed by list decoding. The computer program can run on a processor performing the steps of producing an error indicator based on a decision-codeword, producing a second error indicator based on a modified decision-codeword, determining the validity of the decision-codeword and/or the modified decision-codeword.

In one embodiment, a computer program can run on a processor to perform the Berlekamp-Massey algorithm (BMA), list decoding, iterative decoding, and/or the validity test. The computer program can run on a processor to generate error locator polynomials, perform a Chien search, and/or perform an error evaluation and correction algorithm such as the Forney algorithm. In one embodiment, a computer program can run on a processor to suspend a list decoding computation if a Chien search computation determines that the BMA error locator polynomial is valid.

In one embodiment, a computer program can run on a processor to predict whether list decoding will be needed. The prediction can be based on the value $t=(n-k)/2$ of a RS(n,k) code, a threshold value, and the degree d of an error locator polynomial. If $d \leq (t-\text{threshold})$, then the computer program can predict that list decoding will not be needed. Otherwise, the computer program concludes that list decoding is needed. In one embodiment, the computer program can suspend a list decoding computation if it concludes that list decoding will not be needed.

In one embodiment, an error-correction system may include serially concatenated error-correction codes. In one embodiment, the RS ECC can be an outer code while the second code, such as RLL or MNP, can be an inner code. A detector and/or a post processor can provide an inner decision-codeword with soft-information for the inner decision-codeword. An computer program running on a processor can decode the inner decision-codeword to provide an RS decision-codeword and can provide soft-information for the RS decision-codeword by mapping the soft-information for the inner decision-codeword to the RS decision-codeword.

Soft-information for the inner decision-codeword can include one or more most-likely error events and one or more corresponding next-most likely values. A computer program can use soft-information to produce a modified inner decision-codeword, which can be decoded to produce a modified RS decision-codeword. The computer program can compare the modified RS decision-codeword with a corresponding RS decision-codeword to identify the locations of any corresponding symbols that have different values. Soft-information for the RS decision-codeword can include any such identified symbol locations and the difference between the symbol values at the symbol locations.

Further features of the invention, its nature and various advantages, will be more apparent from the accompanying drawings and the following detailed description of the various embodiments.

BRIEF DESCRIPTION OF THE DRAWINGS

FIG. 10 is an exemplary diagram of the progression of processing through the pipelined stages of FIG. 9;

DETAILED DESCRIPTION

This application is related to the application Ser. No. 12/256,652 entitled "Architecture and Control of Reed-Solomon List Decoding", and the application Ser. No. 12/512,710 entitled "Architecture and Control of Reed-Solomon Error Identification and Evaluation", which applications are hereby incorporated herein by reference in their entirety.

The disclosed technology is directed to systems and methods for implementing a Reed-Solomon error-correction code (RS ECC). In applications or devices where information may be altered by interference signals or other phenomena, Reed-Solomon ECC provides a measured way to protect information against such interference. As used herein, "information" refers to any unit or aggregate of energy or signals that contain some meaning or usefulness.

Figure 1:
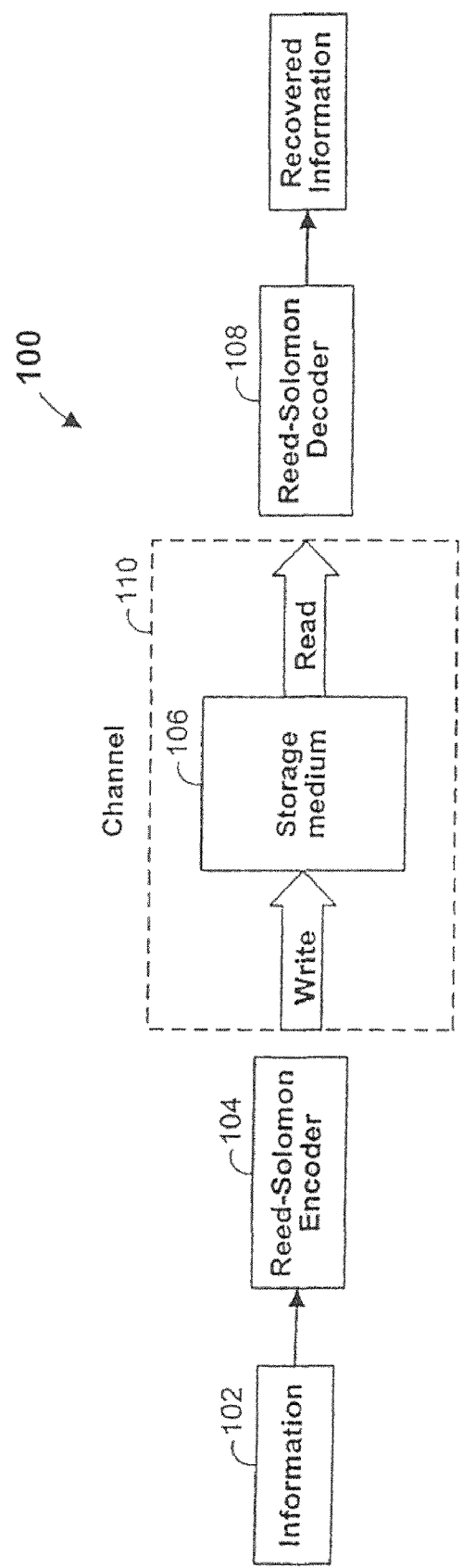
FIG. 1 is a component diagram of an exemplary storage system that employs Reed-Solomon error-correction coding (RS ECC)

Referring to FIG. 1, there is shown an exemplary information storage system 100 that employs a Reed-Solomon error-correction code. Information 102 that is intended for storage can be encoded by a RS ECC encoder 104 before being written to the storage medium 106. Upon retrieving the encoded information from the storage medium, an RS ECC decoder 108 can decode the retrieved information to recover the original information 102. The Reed-Solomon ECC is described in U.S. patent application Ser. No. 11/006,381 (filed Dec. 7, 2004, hereinafter the "Burd reference"), which is hereby incorporated herein by reference in its entirety. Unless otherwise specified, the terminology used in the Burd reference will also apply herein.

With continuing reference to FIG. 1, the RS ECC provides some protection for the information stored on the storage medium 106. This information may encounter a number of error-producing phenomena, such as device physical failure, device electrical failure, signal interference, and/or data loss due to buffer overflow, for example. As used herein, a "channel" will refer to the devices and/or processing stages that occur between an RS ECC encoder and an RS ECC decoder and can correspond to a particular path of media/devices through which a signal can flow, a particular wavelength or time slot which a signal can utilize, and/or another multiple access scheme. For example, in FIG. 1, the channel 110 can correspond to storage and write and read components of a disk drive, including a magnetic storage medium, a disk-drive read/write head, and other storage system components. As used herein, a "read path" of a storage system that stores encoded information includes components and devices that operate to produce un-encoded information and can include an RS ECC decoder 108. Also, the interference signals and other error-producing phenomena in a channel will be referred to herein as "noise." The terms channel and noise are more conceptual than physical and are often difficult to define physically. Even so, as shown by FIG. 1, they do correspond to physical components and devices.

Figure 2:
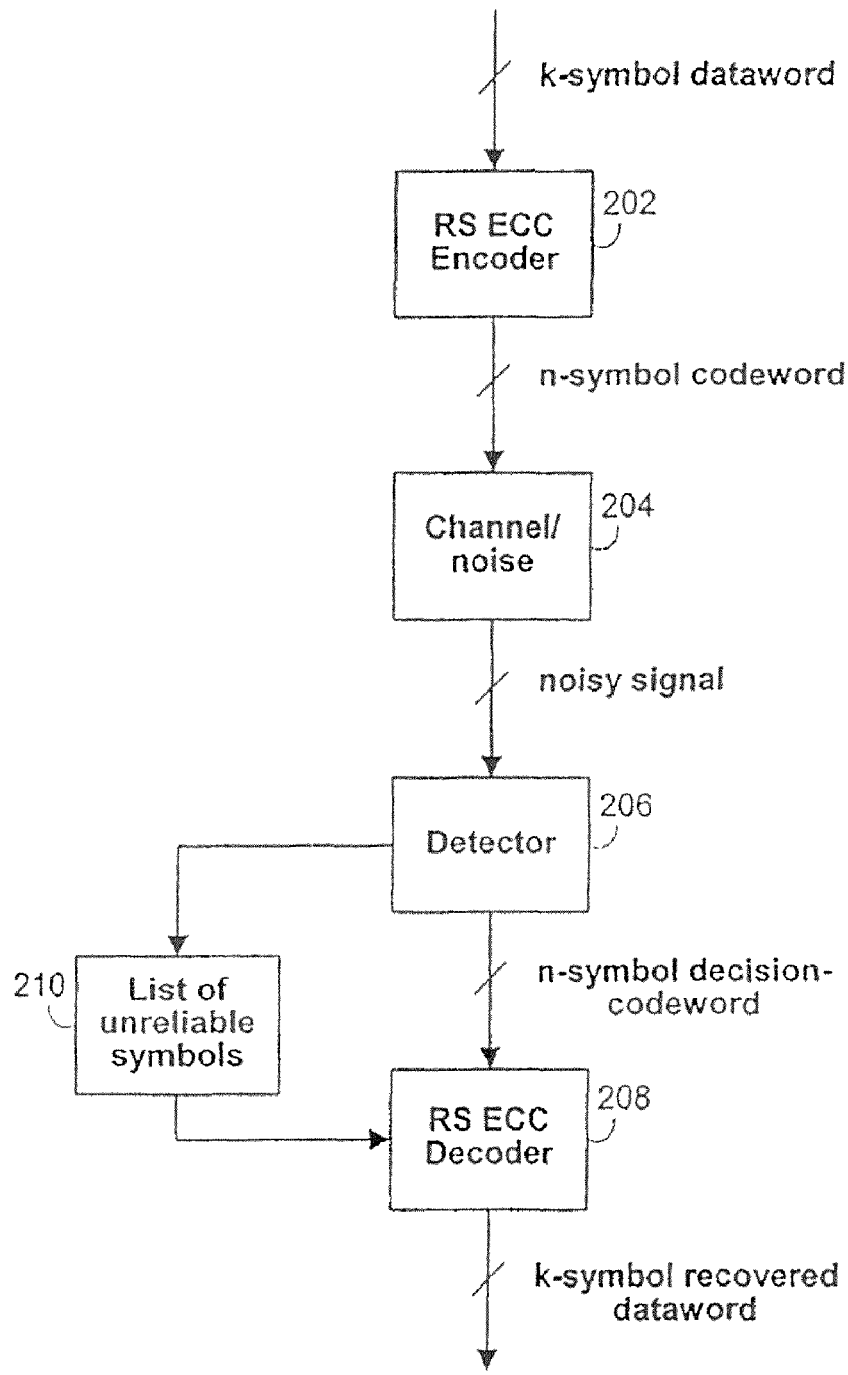
FIG. 2 is a component diagram of a generic system that employs soft-information with Reed-Solomon error-correction coding.

As described in the Burd reference, an RS ECC operates based on units of information called "symbols" and "words," and the operations occur in an encoder and a decoder. Referring to FIG. 2, an RS ECC encoder 202 generally operates to convert a k-symbol dataword into an n-symbol codeword of greater length. Because of this, a Reed-Solomon code is generally identified in shorthand as RS(n,k). RS(n,k) is referred to as a "systematic" code if the n-symbol codeword contains the original k-symbol dataword. These original k symbols are called systematic symbols and the additional (n−k) symbols in the codeword are called "parity" symbols. The n-symbol codeword can be communicated over a channel 204. While in the channel 204, the signal may encounter noise so that an n-symbol word that corresponds to a noisy signal received by a detector 206 may be different from the corresponding codeword that entered the channel 204. This n-symbol word produced by the detector 206 is called a decision-codeword. Thus, the task of the RS ECC decoder 208 is to recover the original dataword from a decision-codeword.

An RS ECC decoder may not always be able to recover the original dataword. As described in the Burd reference, an RS ECC decoder 208 that does not use soft-information is capable of correcting up to t=(n−k)/2 symbol errors in a decision-codeword. In contrast, when the RS ECC decoder 208 uses soft-information to perform decoding, the RS ECC decoder 208 is capable of correcting more than t symbol errors. In practice, an RS ECC decoder first determines whether the errors in a decision-codeword can be corrected. This computation involves two procedures known as the Berlekamp-Massey algorithm (BMA algorithm) and the Chien search, which are described in the Burd reference. In summary, the BMA algorithm produces an error indicator based on the decision-codeword, and the Chien search determines whether the error indicator is "valid." Mis-corrections notwithstanding, if the error indicator is determined to be valid, then the number of symbol errors in the decision-codeword is less than or equal to t. In this case, the RS ECC decoder 208 can correct the errors in the decision-codeword using the Forney algorithm, for example.

In some instances, the number of symbol errors in a decision-codeword may exceed t. In this case, the Burd reference describes a technique known as "list decoding" that may be used to reduce the number of symbol errors in a decision-codeword. List decoding is also described in U.S. patent application Ser. No. 10/135,422, filed Apr. 29, 2002, and in U.S. patent application Ser. No. 10/313,651, filed Dec. 6, 2002, which applications are incorporated herein by reference in their entirety.

List decoding relies on identifying a list of unreliable symbols 210 in a decision-codeword and the symbols' next-most-likely values. This list and these values can be generated by a detector 206 or a post processor (not shown). One way to do so is described in U.S. patent application Ser. No. 09/901,507, filed Jul. 9, 2001, which is hereby incorporated herein by reference in its entirety. Essentially, list decoding is more or less a guess and check technique that may or may not locate and correct errors in a decision-codeword. Based on the premise that low-reliability symbols are more likely to have been detected incorrectly, replacing one or more low-reliability symbols with their next-most-likely values can reduce the number of symbol errors if any of the next-most-likely values happens to be a true and correct value. A decision-codeword whose symbols have been replaced as described is referred to as a modified decision-codeword. In one embodiment, whether the number of errors in a modified decision-codeword still exceeds t can be determined, as before, by applying the BMA algorithm and the Chien search. In embodiments where computation speed is a concern, other computations may be used in place of the BMA algorithm and Chien search. For example, the Burd reference describes an iterative way of generating error indicators, which will be referred to herein as "iterative decoding." While the Burd reference describes one way to perform iterative decoding, other variations are also possible. One variation is described in application Ser. No. 12/256,652. Another variation will now be described. Specifically, starting with error indicators ($\Lambda(x)$, $B(x)$, $S$) for a decision-codeword, new error indicators $$\left(\hat{\Lambda}^{(e_1)} = \frac{\Lambda^{(e_1)}(x)}{x + \alpha^{-j_1}}, B^{(e_1)}(x), S^{(e_1)}\right)$$

for a modified decision-codeword can be computed by using the computations below:

Case 1: $\deg(\Lambda(x)) < \deg(B(x))+2$ $$\Lambda^{(e_1)}(x) = \Lambda(x) + ax\Lambda(x) + bxB(x) \quad \text{(EQ1)}$$

$$B^{(e_1)}(x) = \Lambda(x) + cB(x) \quad \text{(EQ2)}$$

Case 2: $\deg(\Lambda(x)) \geq \deg(B(x))+2$ $$\Lambda^{(e_1)}(x) = \Lambda(x) + axB(x) + bx^2 B(x) \quad \text{(EQ3)}$$

$$B^{(e_1)}(x) = xB(x) + cB(x) \quad \text{(EQ4)}$$

where the variables and their computations are described by the Burd reference. Also, the Burd reference describes a way to predict the validity of an error indicator, which will be referred to herein as the "validity test." Specifically, when there is one extra syndrome, the validity test is:

$$\sum_{i=0} S_{2t-i}\Lambda_i = 0 = 0, \quad \text{(EQ5)}$$

and when there are $\Delta$ extra syndromes, the validity test is:

$$\sum_{i=0} S_{2t+j-1-i}\Lambda_i = 0, i = 1, \ldots, \Delta. \quad \text{(EQ6)}$$

The upper bound of the summations are not specified to indicate that the degree of the polynomials in the equations can vary. One of equations EQ5 and EQ6 is used depending on the number of extra syndromes. When the equality or equalities are determined to be true, the new error locator polynomial can be presumed to be valid and can be passed to a Chien search module where it's validity can be verified. From here on, it will be assumed that list decoding uses iterative decoding to generate error indicators for a modified decision-codeword and predicts the validity of the error indicators using the prediction equation (s).

Figure 3:
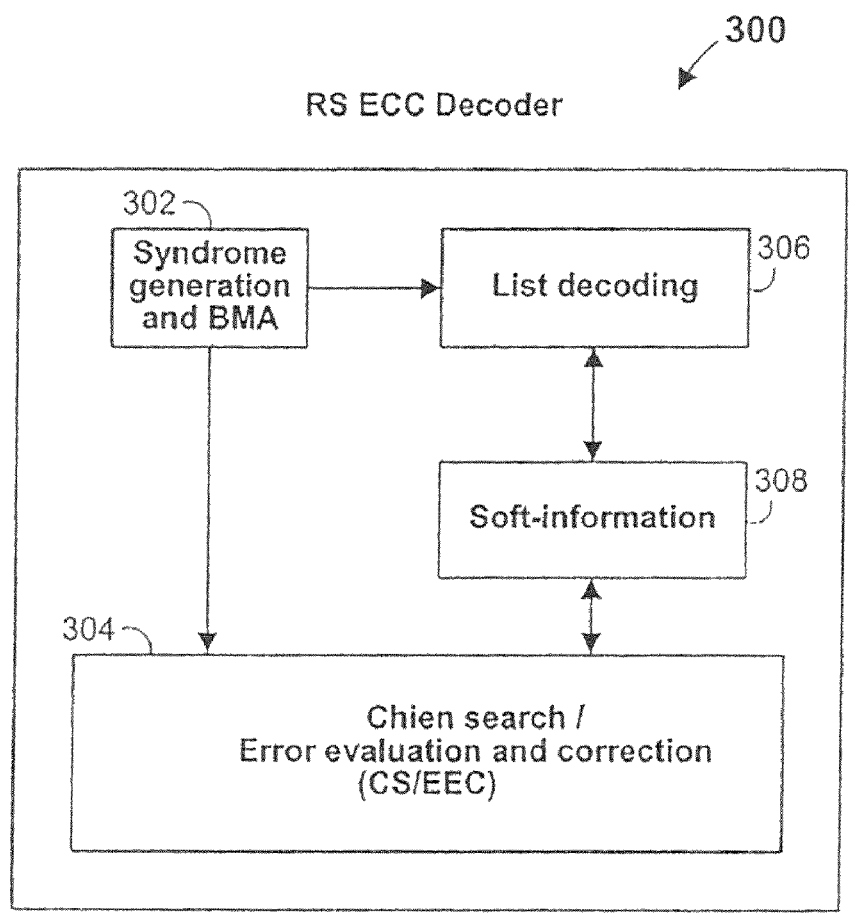
FIG. 3 is a component diagram of an exemplary Reed-Solomon ECC decoder that employs soft-information and list decoding.

Referring now to FIG. 3, there is shown one embodiment of an RS ECC decoder 300. In accordance with what has been described thus far, the exemplary RS ECC decoder includes a BMA algorithm component 302, a Chien search/error evaluation and correction component ("CS/EEC" component) 304, a list decoding component 306, and a soft-information component 308. The soft-information component 308 can store and/or access the list of least reliable symbols and the corresponding next-most-likely values. The RS ECC decoder 300 and its components can be implemented using digital hardware, analog hardware, and/or a processor architecture with programmable instructions. Furthermore, two or more components may operate in whole or in part based on shared circuitry and/or other shared resources.

Figure 4:
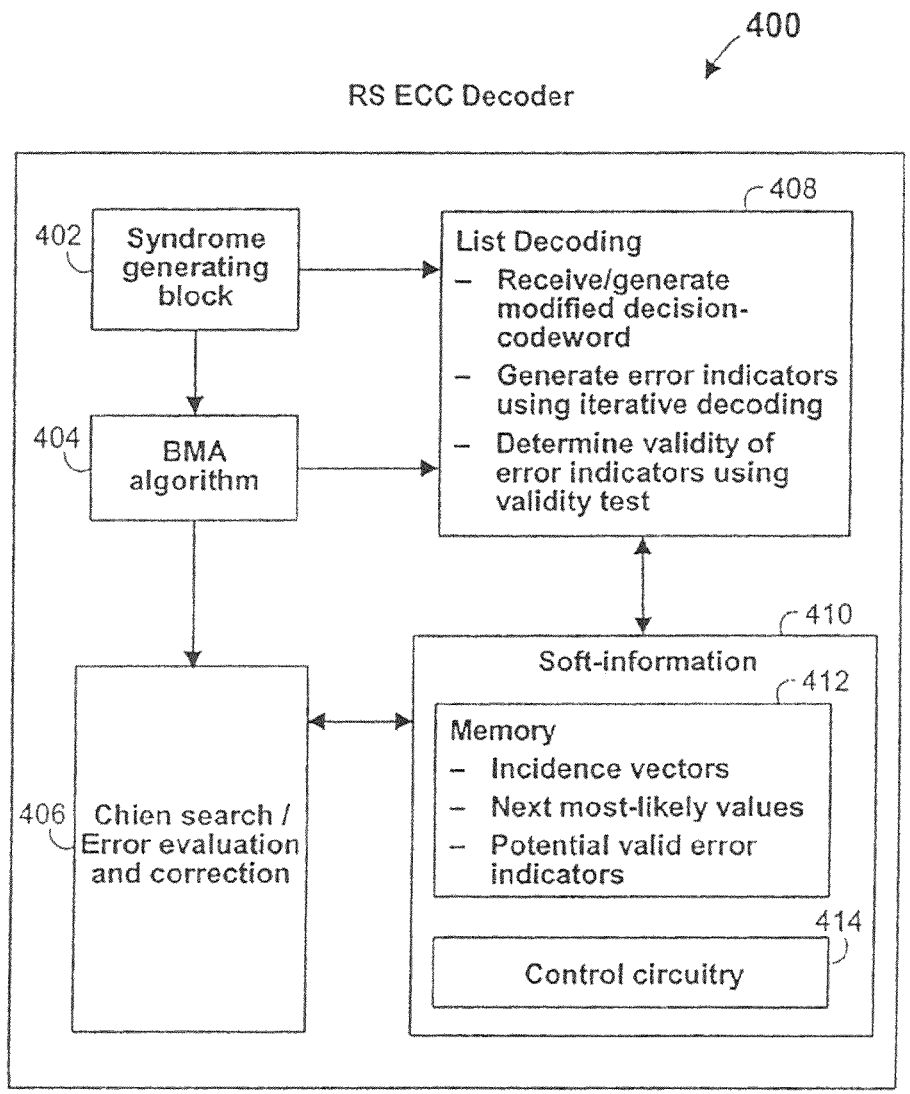
FIG. 4 is a more detailed component diagram of a RS ECC decoder.

Referring to FIG. 4, there is shown a variation of the RS ECC decoder of FIG. 3. In the illustrated embodiment, there is an additional syndrome generating component 402 that was part of the BMA component of FIG. 3. The syndrome generating component 402 produces syndromes based on a decision-codeword, and the BMA algorithm component 404 uses the syndromes to produce error indicators for the decision-codeword. The error indicators can be communicated to the CS/EEC component 406 where the Chien search can determine its validity. The error indicators can also be communicated to the list decoding component 408 for use in iterative decoding. Also for iterative decoding, the list decoding component 408 can receive syndromes from the syndrome generating component 402 or the BMA algorithm component 404.

If the CS/EEC component 406 determines that the error indicator from the BMA algorithm component 404 is invalid, it can provide a notification to a control circuit 414 in the soft-information component 410. In response, the control circuitry 414 can initiate the list decoding component. The soft-information component 410 can contain an internal memory 412 or, alternatively, can communicate with an external memory (not shown) for access to soft-information. The memory 412 can contain incidence vectors that correspond to combinations of symbol errors and next-most-likely values that provide alternative values for the symbols. In one embodiment, the control circuitry 414 can communicate an individual incidence vector and its corresponding next-most-likely value(s) to the list decoding component 408. In response, the list decoding component 408 can generate a modified decision-codeword based on the incidence vector and the next-most-likely value(s). In one embodiment, the soft-information component 410 can generate the modified decision-codeword and can communicate it to the list decoding component 408. If the list decoding component 408 identifies any potentially valid error indicators, it can communicate them to the soft-information component 410 for storage in the memory 412. After a predetermined number or all of the incidence vectors have been processed, the soft-information component 410 can communicate the error indicators in the memory 412, if any, to the CS/EEC component 406 for a Chien search and, if appropriate, for error evaluation and correction.

In the RS ECC decoder of FIG. 4, the components operate by communicating with each other and/or under control of the control circuitry 414 in the soft-information component 410. The following description illustrates one aspect of the invention in which the RS ECC decoder can operate according to a pipelined architecture that is timed by a clock signal.

Figure 5:
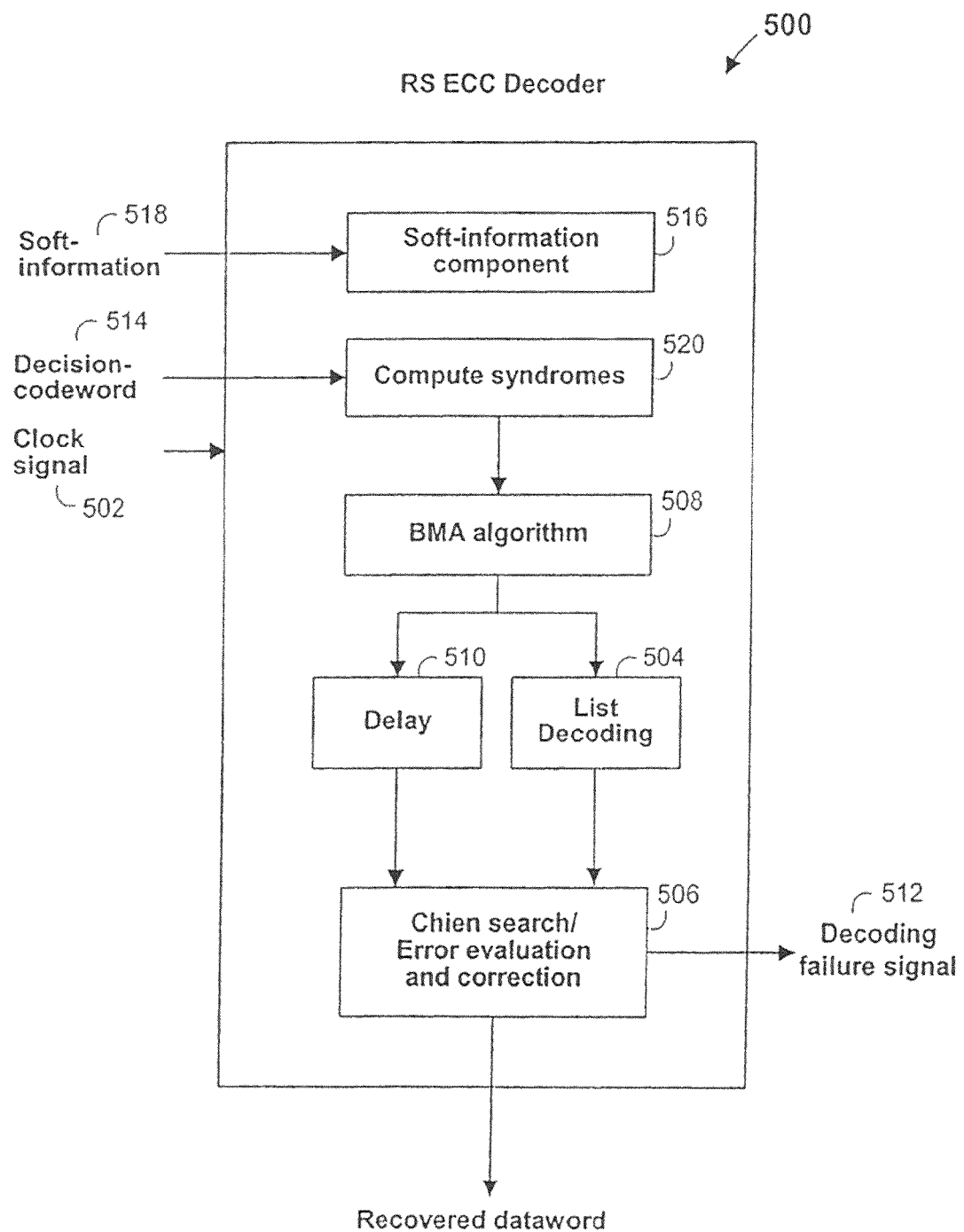
FIG. 5 is a component diagram of an exemplary RS ECC decoder that has a pipelined architecture.

FIG. 5 illustrates one exemplary embodiment of a pipelined RS ECC decoder 500 in accordance with the disclosed technology. A clock signal 502 keeps track of the amount of time that each pipeline stage is allotted to complete its computation. Each such period of time will be referred to herein as a "computing interval." When a computing interval elapses, each stage communicates its results to a next pipeline stage.

As before, the soft-information component 516 receives soft-information 518 related to the decision-codeword 514 for use with list decoding 504. Syndromes are produced by a syndrome computing stage 520. In the illustrated embodiment, an error indicator resulting from the BMA algorithm 508 is not immediately processed by a Chien search but rather is later processed by the CS/EEC stage 506 along with error indicators produced by list decoding 504. This configuration may be beneficial when the CS/EEC stage 506 can process at least two error indicators during a computing interval. The delay component 510 holds the BMA error indicators so that the CS/EEC stage 506 can process the error indicator from the BMA algorithm 508 concurrently with those from list decoding 504 during the same computing interval. If the BMA error indicator is determined to be valid, the CS/EEC stage 506 recovers the original dataword and does not evaluate the other error indicators. Otherwise, the CS/EEC stage 506 continues to process the list decoding error indicators until an error indicator is determined to be valid or until no error indicators remain to be processed. If none of the error indicators are determined to be valid, the CS/EEC stage 506 can provide a signal 512 that indicates a failure to decode the decision-codeword 514.

Figure 6:
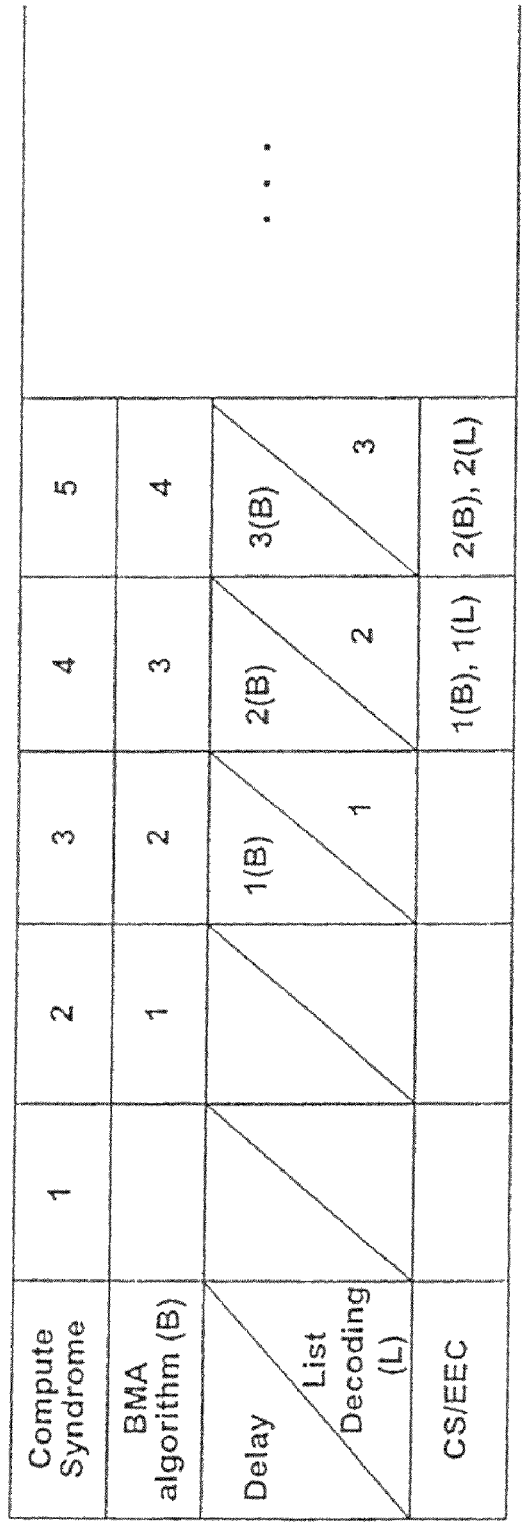
FIG. 6 is an exemplary diagram of the progression of processing through the pipelined stages of FIG. 5.

Although the list decoding stage 504 may potentially have many incidence vectors to process, the actual number of incidence vectors that can be processed by the list decoding component 504 depends on the length of a computing interval. Similarly, although a list decoding stage 504 may identify many error indicators as being potentially valid, the number of error indicators that can be processed by the CS/EEC stage 506 may be limited by the computing interval. FIG. 6 illustrates the progression of processing through the RS ECC decoder of FIG. 5 across several computing intervals. The (B) label represents a result of the BMA algorithm 508, and the (L) label represents a result of the list decoding stage 504. As shown in FIG. 6, there are four pipeline stages that perform processing in connection with a decision-codeword in consecutive computing intervals. The CS/EEC stage 506 can determine the validity of two error indicators during a single computing interval.

The particular pipeline configuration of FIG. 5 is exemplary, and other variations are also contemplated. For example, the number of pipeline stages and/or the length of a computing interval can be increased or decreased based on a number of factors, such as the amount of computing resources available for particular operations in the pipeline and/or a minimum length of time required for a particular operation.

Figure 7:
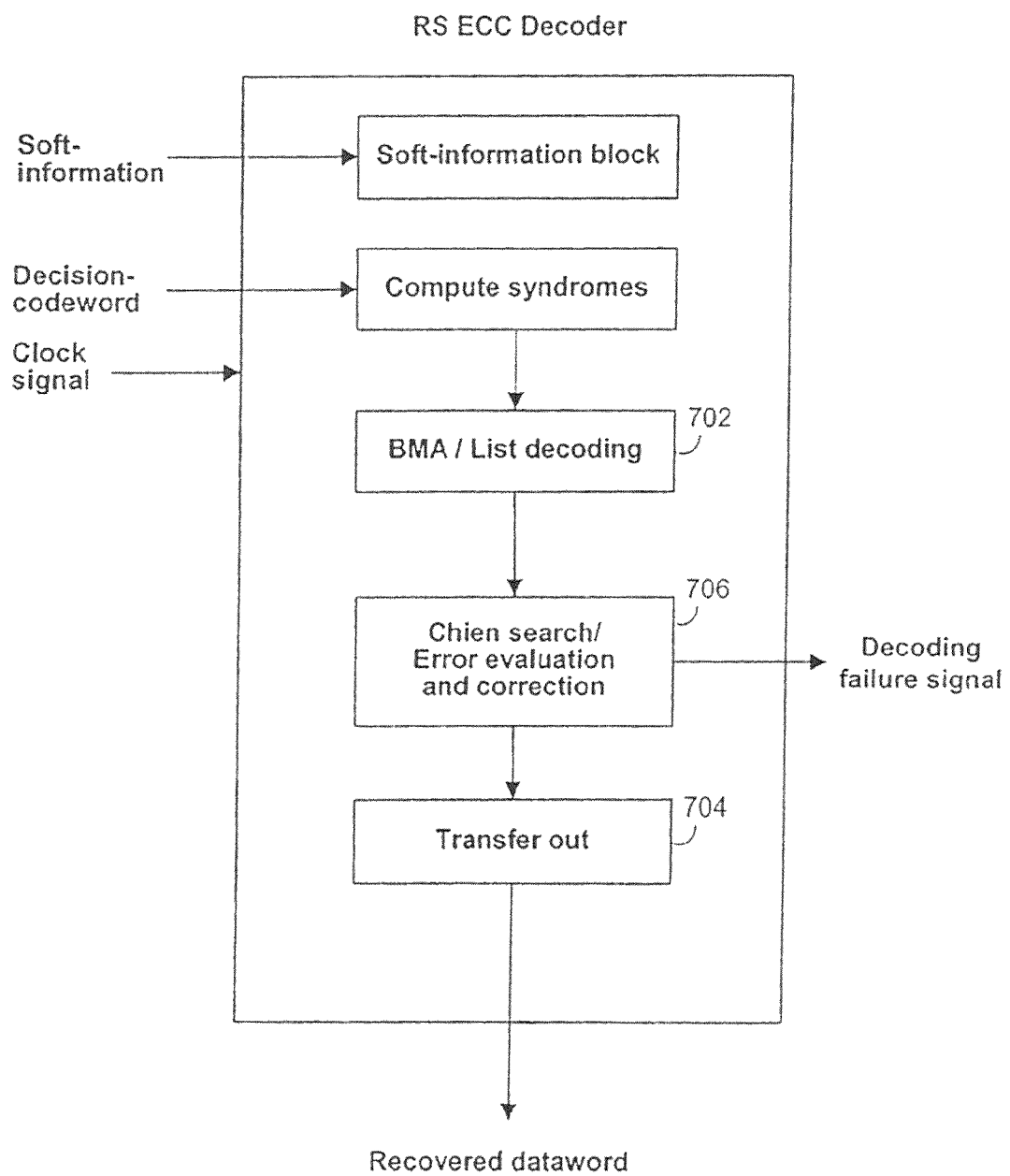
FIG. 7 is a component diagram of another exemplary RS ECC decoder that has a pipelined architecture.

In one embodiment, if the minimum length of time required by the CS/EEC operations to process two error indicators is relatively long, the BMA and list decoding operations can be combined into one stage 702, as shown in FIG. 7. The decoder architecture of FIG. 7 also includes a transfer out pipeline stage 704. Some RS ECC decoders may require this stage to communicate the result of the CS/EEC stage 706 to a subsequent component.

Figure 8:
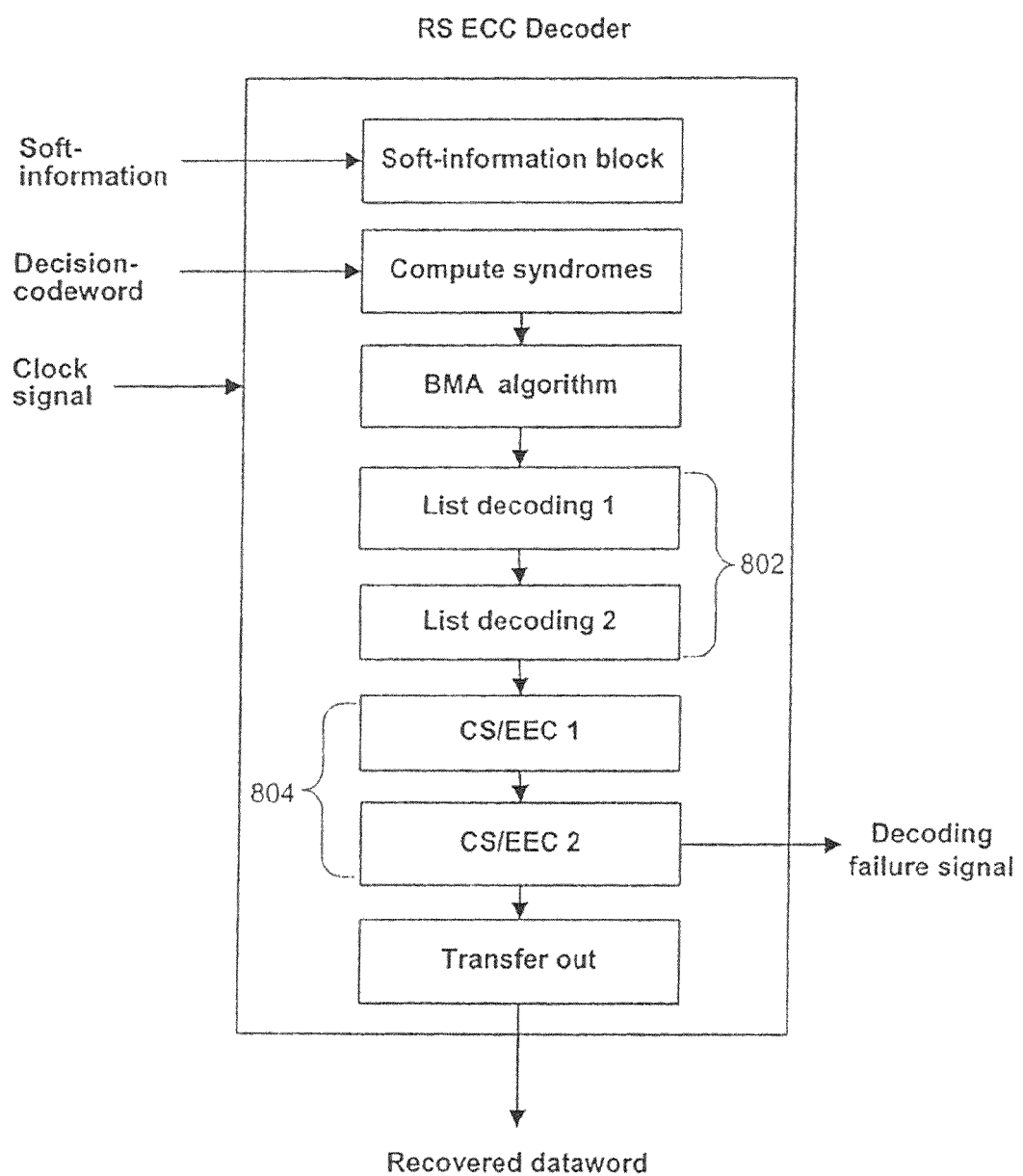
FIG. 8 is a component diagram of an exemplary RS ECC decoder that has greater pipeline depth.

In one embodiment, if the RS ECC decoder's hardware size is not especially constrained, then the number of pipeline stages can be increased to improve the throughput of decision-codewords through an RS ECC decoder. As shown in FIG. 8, the list decoding operation 802 and the CS/EEC operation 804 can each be separated into multiple pipeline stages because distinct incidence vectors and error indicators need not be evaluated in the same pipeline stages.

Figure 9:
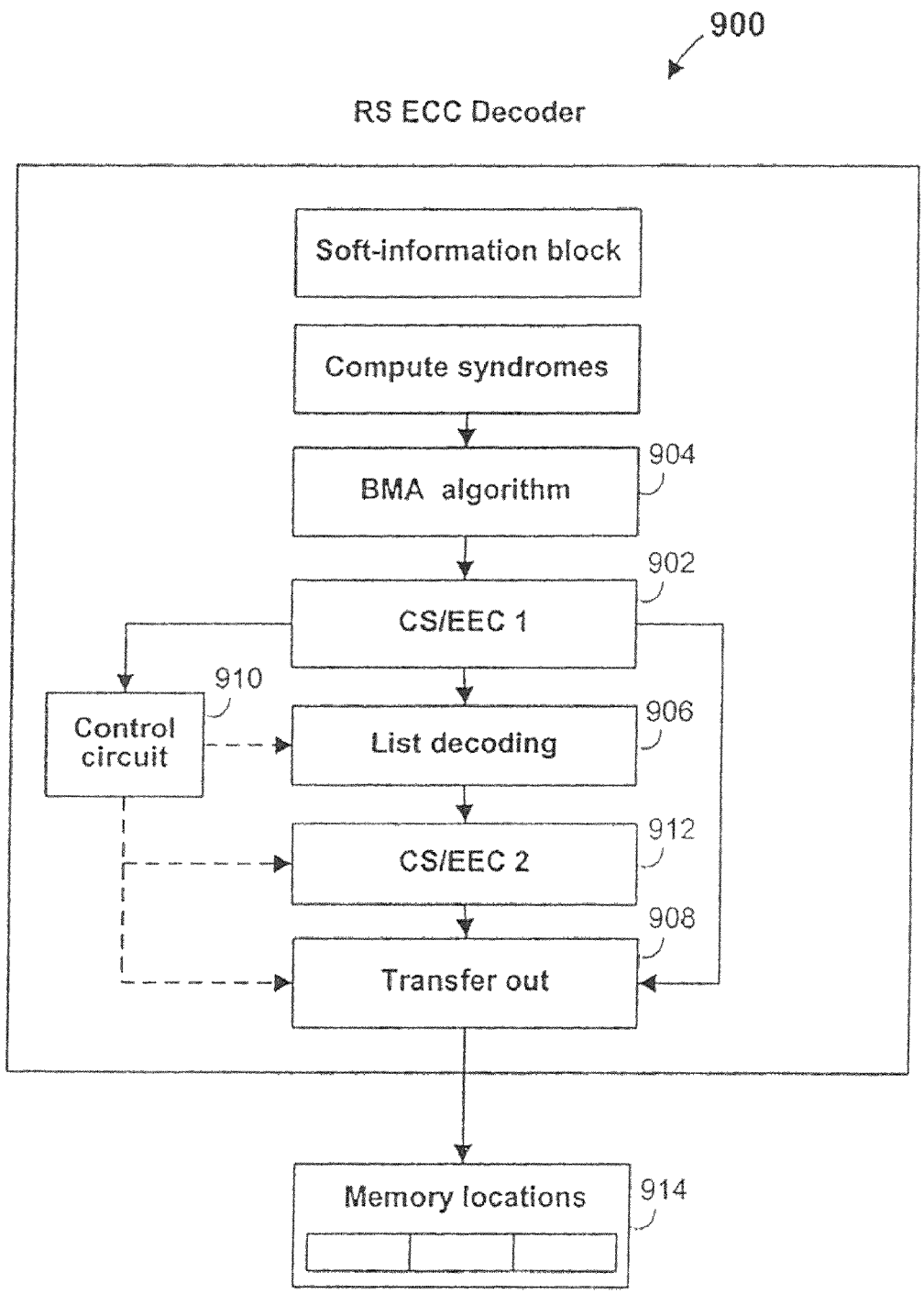
FIG. 9 is a component diagram of an exemplary RS ECC decoder that has a pipelined architecture in which certain pipeline stages can be suspended.

In one embodiment as shown in FIG. 9, a CS/EEC stage 902 can operate immediately after a BMA stage 904 to determine whether the error locator polynomial produced by the BMA stage 904 is valid. If the BMA error locator polynomial is determined to be valid, the control circuit 910 can direct the list decoding stage 906 and the lower CS/EEC stage 912 to suspend operation in subsequent computing intervals. At the same time, the upper CS/EEC stage 902 can communicate a recovered dataword to the transfer out stage 908, which can communicate the recovered dataword to an external memory device 914 in a subsequent computing interval. On the other hand, if the BMA error locator polynomial is determined to be invalid, the control circuit 910 can direct the transfer out stage 908 to ignore the result of the upper CS/EEC stage 902 that was communicated to it. In this case, the list decoding stage 906 and the lower CS/EEC stage 912 can proceed with their operations in the subsequent computing intervals. One feature of the illustrated RS ECC decoder 900 is that overall power consumption may decrease because the list decoding stage 906 is not used for every decision-codeword. At the same time, the illustrated decoder 900 includes two CS/EEC stages 902, 912 and may have an increased latency time for processing a decision-codeword.

In the illustrated embodiment of FIG. 9, the external memory device 914 is shown to include three memory locations, but can include more than three memory locations. The reason for this configuration is shown by FIG. 10, which traces the progression of processing through the RS ECC decoder 900 of FIG. 9. In the illustrated scenario, decision-codeword "two" requires list decoding 906 while subsequent decision-codewords "three" and "four" do not. Accordingly, even though decision-codewords "three" and "four" arrive after decision-codeword "two," they are transferred out of the RS ECC decoder before and at the same time, respectively, as decision-codeword "two." Therefore, the external memory 914 maintains three memory locations to accommodate this scenario. The external memory 914 in this arrangement should be addressable and can shift its memory contents by one location in each computing interval. The transfer out stage 908 in this embodiment can receive and handle two recovered datawords in a computing interval. Additionally, the transfer out stage 908 and/or the control circuit 910 can keep track of the correct memory locations to which recovered datawords should be stored in each computing interval. Also as shown in FIG. 10, the list decoding 906 and lower CS/EEC 912 pipeline stages are suspended in computing intervals that follow a determination by the upper CS/EEC stage 902 that the BMA error locator polynomial is valid.

Figure 11:
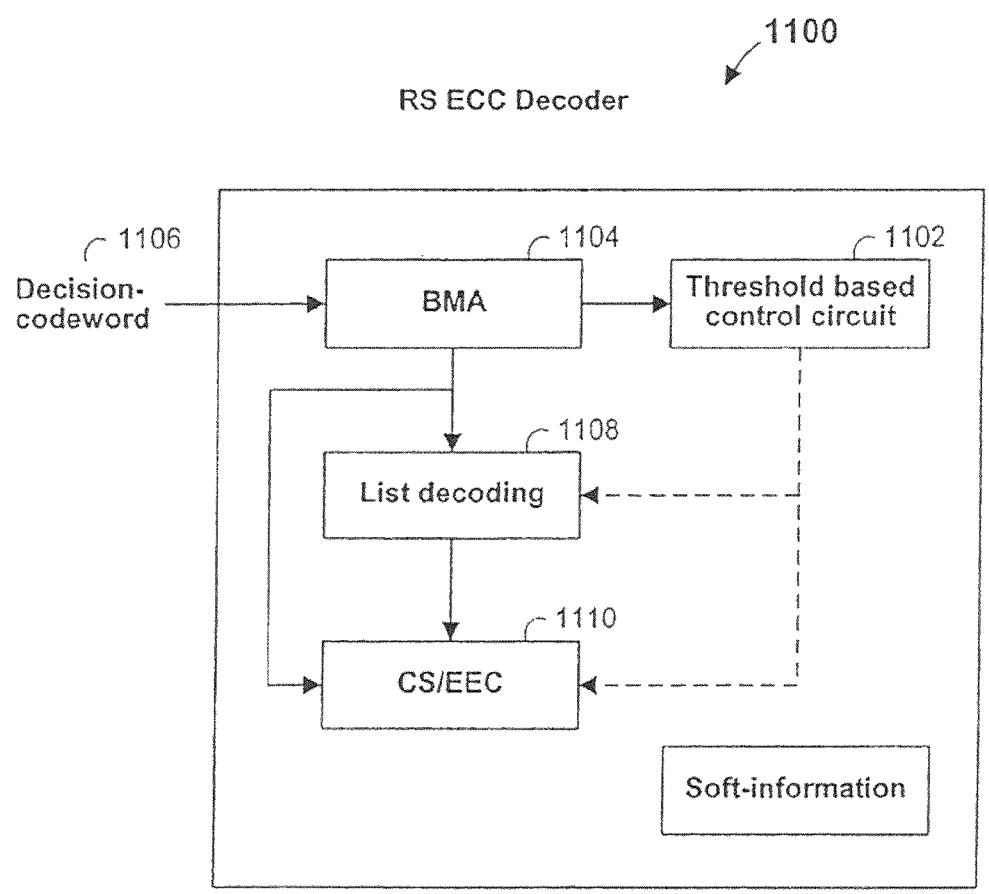
FIG. 11 is an exemplary diagram of an RS ECC decoder that includes a threshold-based control circuit in accordance with one aspect of the invention.

Referring now to FIG. 11, there is shown an RS ECC decoder 1100 that includes a threshold-based control circuit 1102 in accordance with one aspect of the disclosed technology. A BMA component 1104 produces an error locator polynomial based on decision-codeword 1106 and communicates the error locator polynomial to the control circuit 1102. Rather than proceeding with list decoding 1108 or a Chien search 1110, the control circuit 1102 can make a prediction about whether the BMA error locator polynomial $\Lambda(x)$ is valid. Specifically, the control circuit 1102 can perform a comparison:

$$\deg(\Lambda(x)) \leq (t-\text{threshold}), \quad (EQ7)$$

where $\deg((\Lambda(x))$ is the degree of the error locator polynomial, $t=(n-k)/2$, and threshold is a user or system-designated value that can be 0, 1, 2, ..., t. If the inequality is true, the RS ECC decoder 1100 makes the prediction that the error locator polynomial is valid. In this case, the control circuit 1102 directs the list decoding component 1108 to suspend operation and directs the CS/EEC component 1110 to process the error indicators from the BMA component 1104. On the other hand, if the inequality of equation EQ7 is not true, the RS ECC decoder 1100 makes the prediction that the error locator polynomial is invalid. In this case, the control circuit 1102 directs the list decoding component 1108 to perform list decoding, and directs the CS/EEC component 1110 to process the results of the list decoding. In this case, the BMA algorithm is not used.

Figure 12:
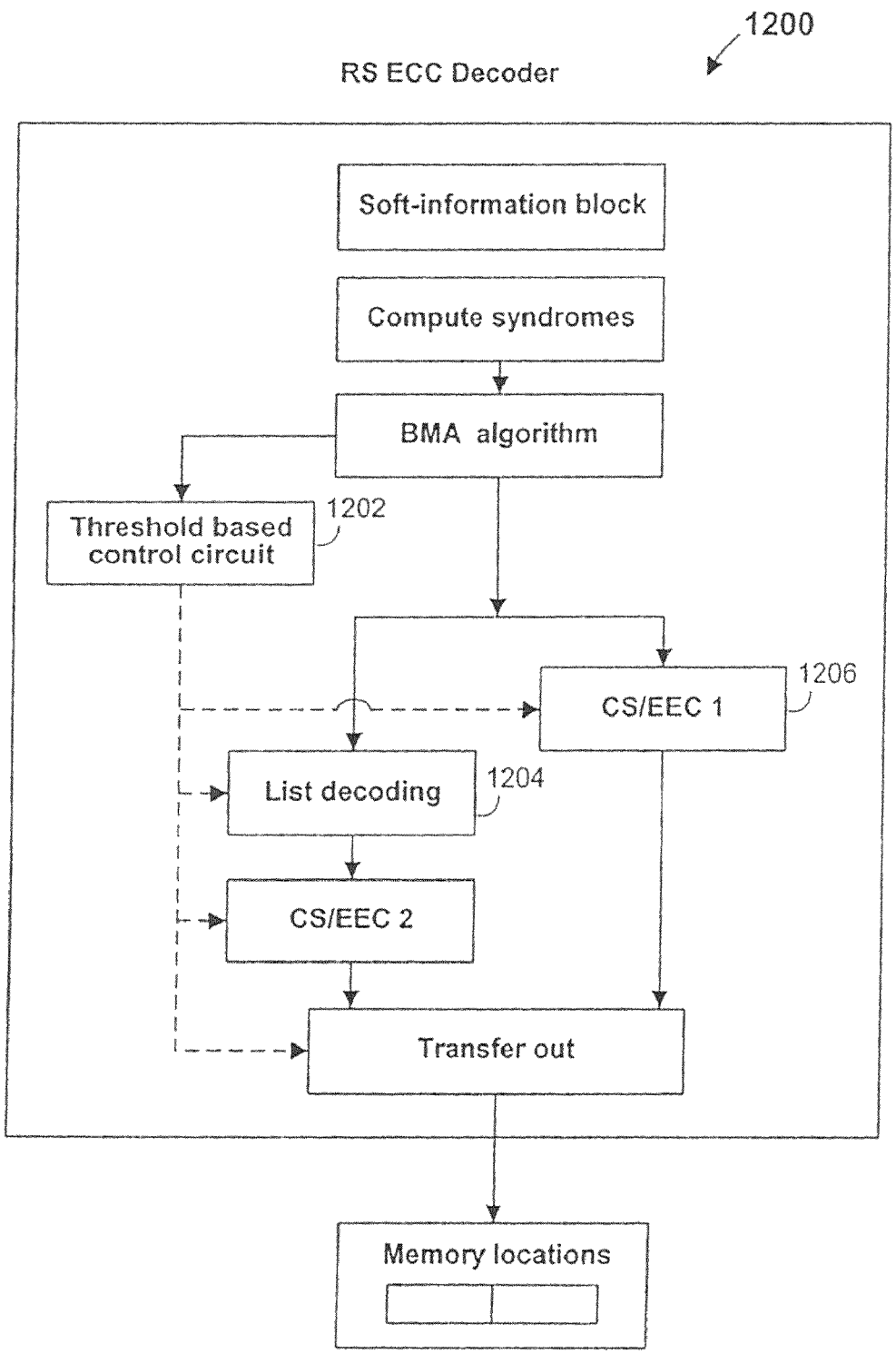
FIG. 12 is a component diagram of another exemplary RS ECC decoder that has a pipelined architecture and includes a threshold-based control circuit.

Referring now to FIG. 12, there is shown a pipelined RS ECC decoder 1200 that contains a threshold-based control circuit 1202. Based on evaluating the comparison in equation EQ7, the control circuit 1202 can instruct one of the list decoding stage 1204 and the upper CS/EEC stage 1206 to operate and the other one to suspend. In this manner, the control circuit 1202 makes a decision about whether list decoding will be used.

The RS ECC decoder 1200 of FIG. 12 makes a prediction about whether to use list decoding based on a threshold value, where smaller threshold values allow the list decoding 1204 to be invoked less frequently. In one embodiment, when it is possible for a decision-codeword to have around t errors but the probability of such an occurrence is relatively low, the threshold value can be set to a value such as two or four. Since list decoding is generally power and time intensive, using the prediction in equation EQ7 can result in both a power and time savings, although the savings in power may be more beneficial. However, the prediction is susceptible to making an incorrect conclusion, such as a false positive or a false negative identification. A false positive identification can occur when list decoding is invoked even though BMA can correct all of the symbol errors. For example, if the number of symbol errors is t, then equation EQ7 would be false for threshold values greater than zero. False positive identification may not result in performance degradation, but may have an adverse impact on power consumption because list decoding is invoked. False negative identification occurs if a RS ECC decision-codeword has more than t errors, but equation EQ7 is satisfied. Therefore, list decoding is not invoked even though it is needed. False positive identifications can have an adverse impact on performance, and the probability of such an occurrence is proportional to $q^{-threshold}$. Despite the possibility of incorrect predictions, the power and time savings from using a threshold-based prediction, in appropriate situations, may outweigh any detriment related to the occurrences of erroneous decisions.

Figure 13:
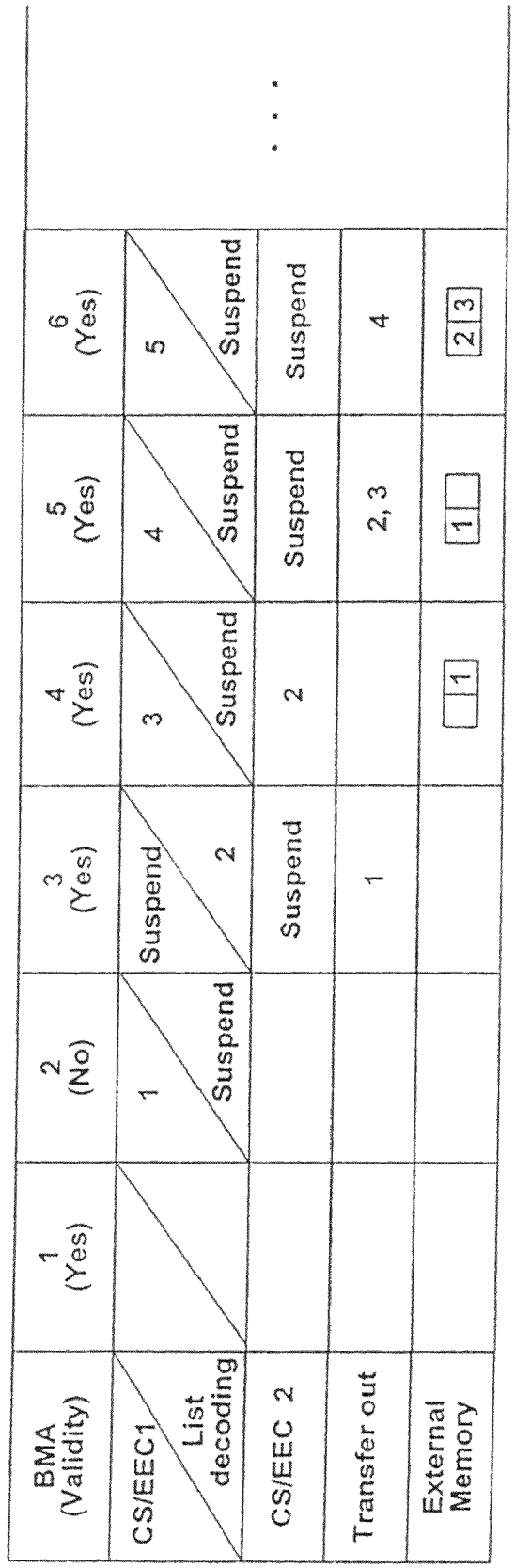
FIG. 13 is an exemplary diagram of the progression of processing through the pipelined stages of FIG. 12.

FIG. 13 traces the progression of processing through the pipeline stages of FIG. 12. In this embodiment, the memory device includes at least two memory locations. In each computing interval, one of the list decoding component 1204 and the upper CS/EEC component 1206 is suspended based on the comparison of EQ7.

Figure 14:
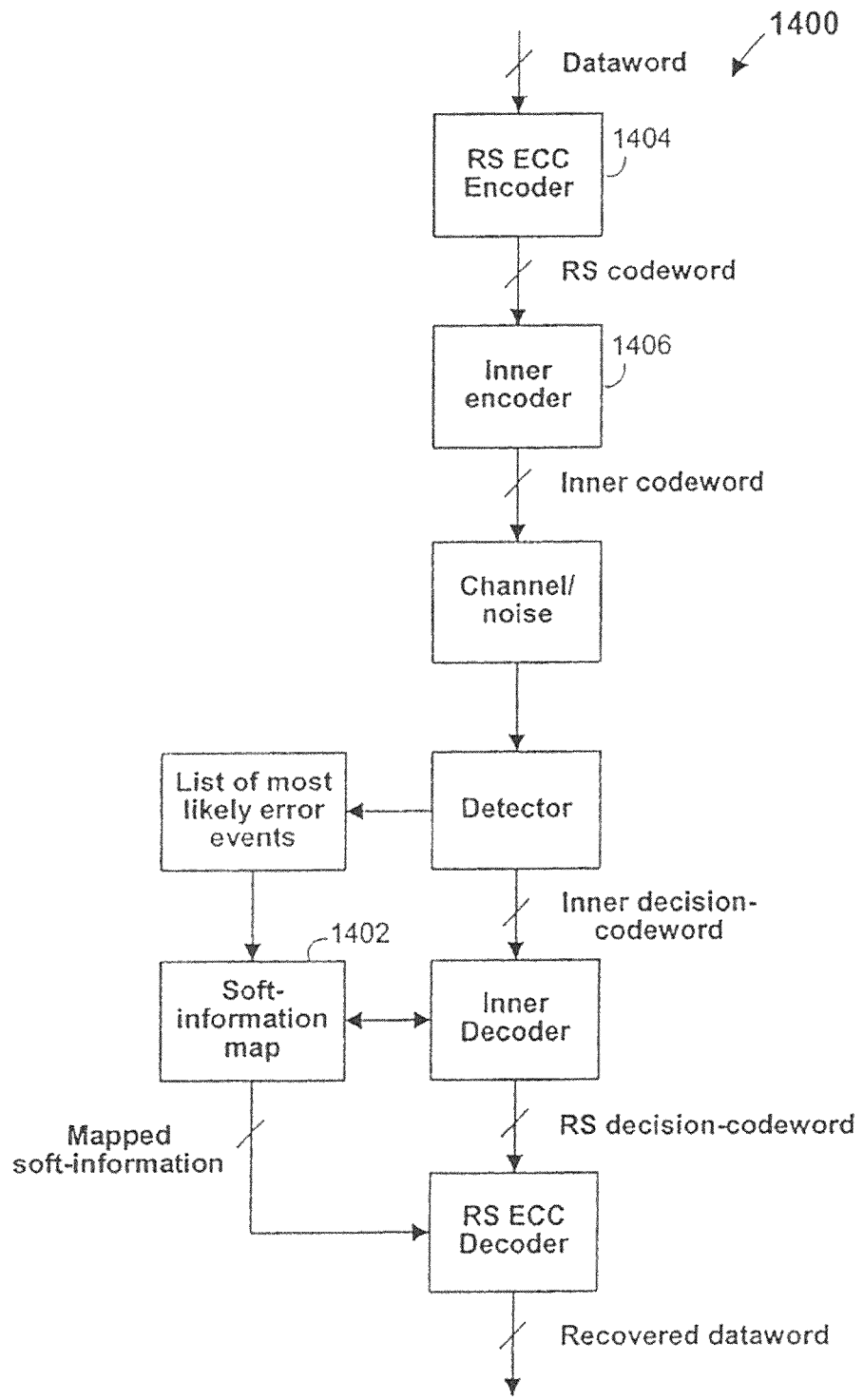
FIG. 14 is a component diagram of a generic system that employs a soft-information map in accordance with one aspect of the invention.

Referring now to FIG. 14, there is shown an error-correction system 1400 that includes a soft-information map 1402 in accordance with one aspect of the invention. The illustrated system 1400 includes two serially-concatenated codes, where the code that is applied first (on the encoding side) is referred to herein as an "outer code" and the code that is applied second is referred to herein as an "inner code." In the illustrated system, the outer code 1404 is a Reed-Solomon error-correction code, and the inner code 1406 is another code that can be, for example, a run length limited (RLL) modulation code and/or a Single Parity check code, both of which are commonly used in magnetic disk drive systems.

Serially concatenated codes can operate in many different ways. For example, an inner code can be configured to encode only whole codewords from the outer code or can be configured to encode portions of outer-code codewords. An inner code can encode one outer-code codeword, multiple outer-code codewords, portions of outer-code codewords, or some combination thereof. It will be understood that the embodiment of FIG. 14 and the disclosed technology can apply any of these configurations.

Figure 15:
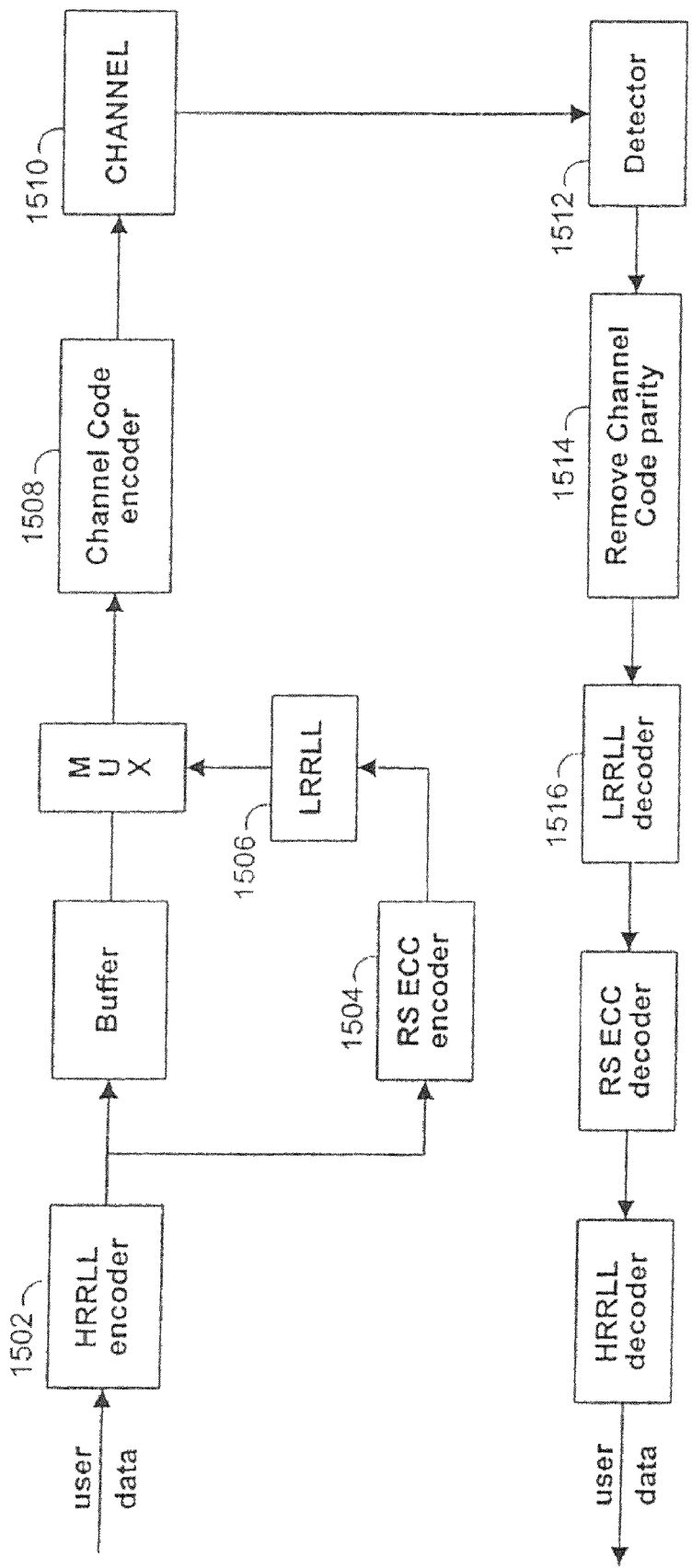
FIG. 15 is a diagram of an exemplary magnetic recording system having multiple serially-concatenated codes.

FIG. 15 shows a diagram of an exemplary magnetic recording system in which there are multiple serially-concatenated codes. The user data is first encoded by a high rate RLL (HR RLL) encoder 1502, and then communicated to a systematic RS ECC encoder 1504. Since the RS ECC encoder 1504 is a systematic encoder, RLL constraint imposed by the HR RLL encoder 1502 on the user data will be preserved after RS ECC encoding. However RS ECC redundancy is not guaranteed to have RLL constraint. For this reason, a low rate RLL (LR RLL) encoder 1506 is used to encode the RS ECC redundancy bits, after RS ECC encoding. In one embodiment, the LR RLL encoder 1506 has rate-30/31 (i.e., 30 bits are encoded to become 31 bits). In another embodiment, the LR RLL encoder 1506 can treat the entire RS ECC parity portion as a single codeword. Following the LR RLL encoder 1506 is an optional channel code encoder 1508, which can implement an error detection code or an error correction code, such as single parity check code or low density parity check (LDPC) code. The channel code encoder 1508 is optional, and embodiments that do not use a channel code encoder 1508 are also contemplated. The output of the encoding side is then communicated to the channel 1510.

On the decoding side, a detector 1512 is used to decode output from the channel 1510. The detector 1512 can be configured to carry out joint channel/code decoding. For example, Viterbi detection with parity in the trellis can be used to simultaneously decode channel and single parity check codes. In one embodiment, the detector 1512 can include separate components that perform channel and code decoding separately. In one embodiment, a Viterbi detector can be used to perform channel decoding, while a post processor can be used to perform Single Parity Check decoding.

Following the detector 1512 is a block 1514 that is responsible for removing channel code parity. This block 1514 is needed in the illustrated embodiment because channel code parity is not part of the RS ECC codeword. There is also a block 1516 that is responsible for performing LR RLL decoding for RS ECC redundancy bits. Now, the soft information obtained by the detector 1512 is in the "channel" domain, while what is needed by for RS ECC decoding is soft information in the "RS ECC" domain, where the remove channel code parity block 1514 and the LR RLL decoder block 1516 together separate the channel domain from the RS ECC domain. A soft information Map (SIM) block is responsible for mapping the soft information from the channel domain to the RS ECC domain, as described by the following sections.

Error events are described in U.S. patent application Ser. No. 09/901,507, filed Jul. 9, 2001, which will be referred to hereinafter as the Wu reference. As previously described, a channel can contain noise that can introduce errors into a decision-codeword. The Wu reference describes that the noise on a channel can be characterized by particular types of errors that probabilistically occur most frequently. These errors can be represented by strings of "+", "−", "1", and "0" designations, such as "+−+", which are referred to herein as "error types." Each designation corresponds to a single bit and indicates a particular pattern of error. Specifically, "+" designates that a bit value was flipped from one to zero, "−" designates that a bit value was flipped from zero to one, "1" indicates that a bit value was flipped, and "0" indicates a bit value was not flipped. As an example, for a magnetic recording channel, the error types that most frequently occur include "+", "+−", "+−+", "+−+−", "+−+−+" and "+0+". The Wu reference describes a way to generate a reliability metric and a next-most-likely value for each bit of a particular decision-codeword by using error types. The list of most-likely error events 1416 is selected from among the bits and/or symbols that are associated with the lowest reliability metric values. For example, the reliability metric values for each bit can be sorted into a descending order, and the lowest six values can be selected. Then, the six decision-codeword bit locations corresponding to these six lowest reliability metric values can be designated as error events. The next-most-likely value for each bit locations is the flipped value of the bit in the bit location.

Although the Wu reference describes generating bit-log-likelihood-ratios for reliability metrics, in one embodiment, a detector 1408 and/or a post processor (not shown) can also generate symbol-based reliability metrics. Techniques for generating such symbol-based reliability metrics include, for example, the soft-output Viterbi algorithm and other soft-output detectors. Using symbol-based reliability metrics, a list of most-likely error events can contain a location of a symbol error and the symbol's next-most-likely value.

Figure 16:
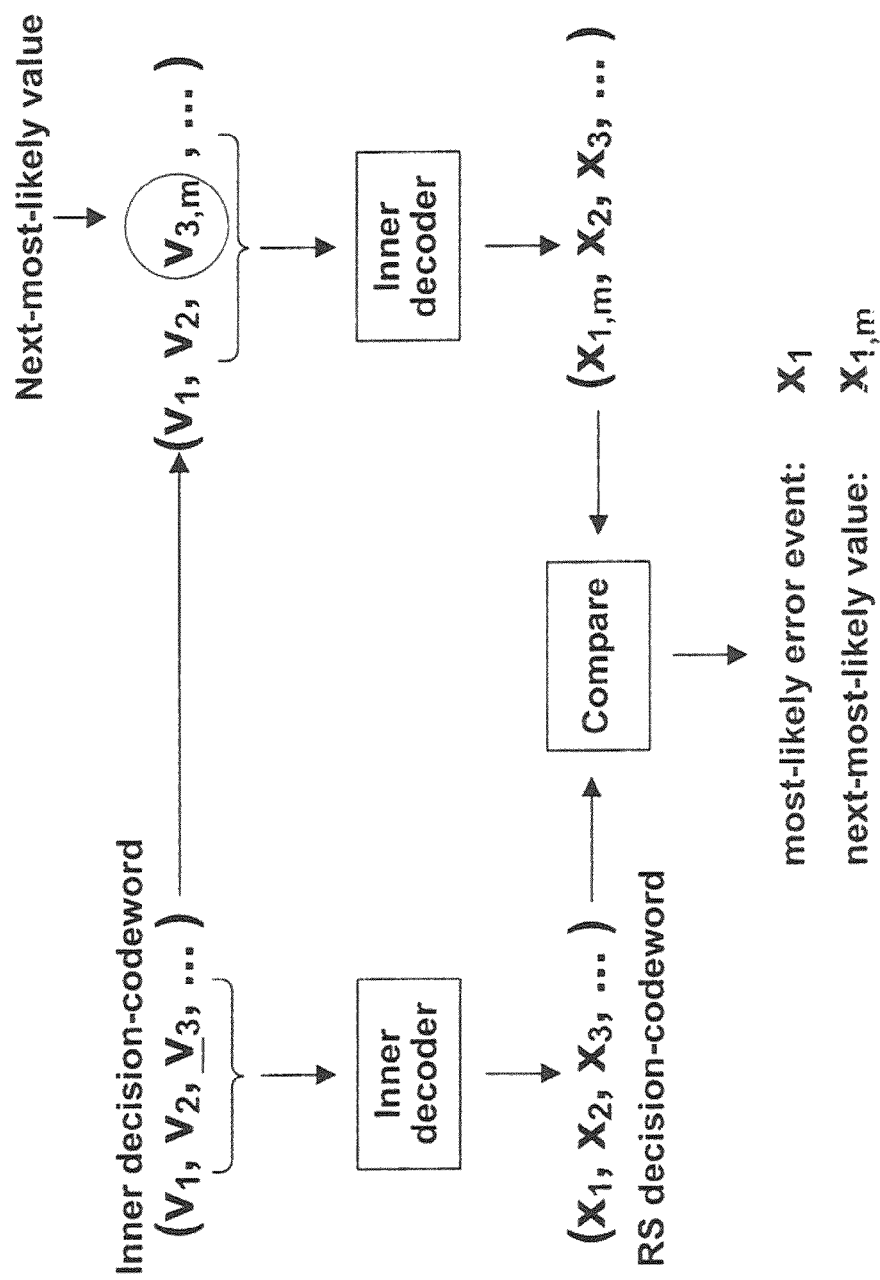
FIG. 16 is a diagram illustrating an exemplary operation of mapping soft-information for an inner decision-codeword to an RS decision-codeword.

FIG. 16 shows an inner decision-codeword in which symbol $v_3$ is a most-likely error event. Decoding the inner decision-codeword using an inner decoder produces an RS decision-codeword having symbols $(x_1, x_2, x_3, \ldots)$. To generate soft-information for the RS decision-codeword, a SIM can replace the symbol $v_3$ in the inner decision-codeword with its next-most-likely value, designated in the illustration as $v_{3,m}$. This resulting word can be decoded by an inner decoder to provide an RS decision-codeword that contains a next-most-likely value $x_{1,m}$. By comparing the two RS decision-codewords and identifying differences in their values, the SIM can recognize that the first symbol is different and is therefore the "mapped" most-likely error event for the RS decision-codeword. The value of symbol $x_{1,m}$ would then be the next-most-likely value for $x_1$. There may be some situations in which two or more error events in an inner decision-codeword map to the same symbol in a RS decision-codeword. In one embodiment, when this occurs, only one such error event for the inner decision-codeword is mapped to the RS decision-codeword symbol, and other error events that map to the same symbol are not used. For example, the inner decision-codeword error event that is used can be arbitrary, such as the first error event that was mapped to the RS decision-codeword symbol. In this manner, the soft-information for the inner decision-codeword can be mapped to the RS decision-codeword.

As an example, and with reference to FIG. 14, suppose that an inner code converts a ten-bit RS codeword to an eleven-bit inner codeword as follows: if the first bit of the RS codeword symbol is "zero", the inner encoder swaps the first and last bits and appends a "one" to the end of the RS codeword, and if the first bit is a "one", the inner encoder simply appends a "zero" to the end of the RS codeword. Thus, for an RS codeword 1000000001, the resulting inner codeword would be 10000000010. Suppose that because of noise, the inner decision-codeword is detected as 10000000001, with an error in the last two bits. Based on this inner decision-codeword, the inner decoder would produce 0000000001 as the RS decision-codeword symbol. Assuming that the error in the last two bits is in the list of most-likely error events and the next-most-likely value is 10, the SIM 1402 can map the error event to the RS decision-codeword by: modifying the last two bits to the next-most-likely value 100000000010, decoding this inner decision-codeword using the inner decoder to produce the RS decision-codeword 1000000001, and comparing the two RS decision-codewords 0000000001 and 1000000001. Based on this comparison, it can be seen that the most-likely error event has been remapped to the first bit in the RS decision-codeword. The RS decision-codeword value for this bit is "zero", and the next-most-likely value is one. Accordingly, the SIM component 1402 can be used to map soft-information from an inner decision-codeword to an RS decision-codeword. An RS decoder can then use the mapped soft-information for list decoding the RS decision-codeword.

As another example, and with reference to FIG. 15, consider a rate-60/61 single parity check code encoder 1508. The encoder partitions the input data stream into words of length sixty bits. For each such word, the encoder adds a single parity bit in such a way as to make the sum (modulo two) of all sixty-one bits be zero. On the decoding side, the parity remove block 1514 removes every sixty-first bit. Assume that there's indication that the bit at location sixty (starting from location zero) is an error and that the error is a "+" error event. Since location sixty is a parity bit and is not part of the RLL codeword, a SIM block maps this error event to a null error event, i.e. it disappears. Now, consider a "+−" error event in the channel domain ending at location sixty. This error event should be mapped to a "+" error event at location fifty-nine in the LR RLL domain. If, after the mapping, the resulting error event falls in a LR RLL encoded portion, then the resulting error event needs to be further mapped to the RS ECC domain.

Accordingly, what have been described thus far are components and architectures for implementing a Reed-Solomon error-correction system. The disclosed circuits, components, and methods can be implemented using means such as digital circuitry, analog circuitry, and/or a processor architecture with programmable instructions. Additionally, components and/or methods that store information or carry signals can operate based on electrical, optical, and/or magnetic technology, and can include devices such as flip-flops, latches, random access memories, read-only memories, CDs, DVDs, disk drives, or other storage or memory means. The disclosed embodiments and illustrations are exemplary and do not limit the scope of the disclosed technology as defined by the following claims.

What is claimed is:

1. A method for decoding a dataword based on a decision-codeword using a Reed-Solomon decoder, the Reed-Solomon decoder comprising a first pipeline stage, a second pipeline stage, and a third pipeline stage, the method comprising:
   receiving a decision-codeword;
   producing a modified decision-codeword based on the received decision-codeword;
   producing a first error indicator based on the received decision-codeword using the first pipeline stage;
   producing a second error indicator based on the modified decision-codeword using the second pipeline stage; and
   determining a validity of at least one of the first error indicator and the second error indicator using the third pipeline stage.

2. The method of claim 1, further comprising producing a soft-information component based on the modified decision-codeword.

3. The method of claim 2, wherein producing the soft-information component further comprises:
   determining a most-likely error event;
   determining an incidence vector; and
   determining a next most-likely value that corresponds to the most-likely error event.

4. The method of claim 1, wherein:
   producing the first error indicator further comprises running a Berlekamp-Massey algorithm in the first stage pipeline; and
   producing the second error indicator further comprises running a list decoding algorithm in the second stage pipeline.

5. The method of claim 4, wherein the list decoding algorithm uses iterative decoding.

6. The method of claim 1, wherein:
   each of the first error indicator and the second error indicator comprises a plurality of error locator polynomials; and
   determining the validity of at least one of the first error indicator and the second error indicator further comprises performing a Chien search on the plurality of error locator polynomials.

7. The method of claim 5, wherein performing the Chien search further comprises computing error values in the received decision-codeword using a Forney algorithm in response to the Chien search identifying a valid error locator polynomial.

8. The method of claim 1, further comprising receiving a clock signal that is indicative of a computing interval for the first pipeline stage, the second pipeline stage, and the third pipeline stage.

9. The method of claim 1, wherein the second pipeline stage is used earlier than the third pipeline stage.

10. The method of claim 1, wherein the third pipeline stage is used later than the first pipeline stage and is used earlier than the second pipeline stage.

11. The method of claim 10, further comprising suspending the use of the second pipeline stage if the third pipeline stage determines that the first error indicator is valid.

12. The method of claim 1, wherein the Reed-Solomon decoder further comprises a syndrome computation stage, and the method further comprises:
   computing a plurality of syndromes based on the received decision-codeword using the syndrome computation stage; and
   receiving the plurality of syndromes at the first pipeline stage.

13. The method of claim 1, further comprising producing a decoded dataword based on determining the validity of at least one of the first error indicator and the second error indicator.

14. A method for decoding a dataword based on a decision-codeword using a Reed-Solomon decoder, the Reed-Solomon decoder comprising a plurality of pipelines stages, the method comprising:
   receiving a decision-codeword;
   producing a partially decoded decision-codeword based on the received decision-codeword;
   producing a first error indicator based on the received decision-codeword using a first pipeline stage of the plurality of pipeline stages; and
   producing a second error indicator based on the partially decoded decision-codeword using a second pipeline stage of the plurality of pipeline stages.

15. The method of claim 14, wherein producing the partially decoded decision-codeword further comprises performing list decoding on the received decision-codeword.

* * * * *